(12) United States Patent
Shin et al.

(10) Patent No.: US 9,804,461 B2
(45) Date of Patent: Oct. 31, 2017

(54) DISPLAY DEVICE AND METHOD OF MANUFACTURING THE SAME

(71) Applicant: Samsung Display Co., Ltd., Yongin-si (KR)

(72) Inventors: Dong Chul Shin, Seoul (KR); Jin Won Kim, Suwon-si (KR); Oh Jeong Kwon, Hwaseong-si (KR); Dong Han Song, Hwaseong-si (KR); Taek Joon Lee, Hwaseong-si (KR); Ki Chul Shin, Seongnam-si (KR); Hyeok Jin Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/049,306

(22) Filed: Feb. 22, 2016

(65) Prior Publication Data

US 2017/0023837 A1  Jan. 26, 2017

(30) Foreign Application Priority Data

Jul. 22, 2015  (KR) ........................ 10-2015-0103902

(51) Int. Cl.
| | |
|---|---|
| *G02F 1/1362* | (2006.01) |
| *H01L 29/417* | (2006.01) |
| *H01L 27/12* | (2006.01) |
| *G02F 1/1343* | (2006.01) |

(52) U.S. Cl.
CPC ...... *G02F 1/136227* (2013.01); *H01L 27/124* (2013.01); *H01L 27/1259* (2013.01); *H01L 29/41733* (2013.01); *G02F 1/134309* (2013.01); *G02F 2001/136222* (2013.01)

(58) Field of Classification Search
CPC .......................................... G02F 2001/136268
See application file for complete search history.

(56) References Cited

U.S. PATENT DOCUMENTS

| | | | |
|---|---|---|---|
| 7,394,510 B2 | 7/2008 | Oh et al. | |
| 2004/0125277 A1* | 7/2004 | Kim ................. | G02F 1/136209 349/106 |
| 2005/0174503 A1* | 8/2005 | Kim ................. | G02F 1/136286 349/46 |

(Continued)

FOREIGN PATENT DOCUMENTS

| | | |
|---|---|---|
| KR | 10-2011-0117579 | 10/2011 |
| KR | 10-1198819 | 11/2012 |

*Primary Examiner* — Dennis Y Kim
(74) *Attorney, Agent, or Firm* — H.C. Park & Associates, PLC

(57) ABSTRACT

A display device includes: a substrate; a gate line disposed on the substrate and extending in a first direction; a data line insulated from the gate line and extending in a second direction intersecting the first direction; a pixel electrode disposed in a pixel region defined by the gate line and the data line; a source electrode connected to the data line; a drain electrode spaced apart from the source electrode; and a color filter layer disposed on the data line, the source electrode, and the drain electrode. The color filter layer includes: a first contact hole exposing the drain electrode, and a second contact hole disposed over at least one of the source electrode and the drain electrode. The pixel electrode is disposed on the color filter layer and is connected to the drain electrode through the first contact hole.

12 Claims, 14 Drawing Sheets

(56) References Cited

U.S. PATENT DOCUMENTS

| | | | |
|---|---|---|---|
| 2006/0146221 A1* | 7/2006 | Tabata | G02F 1/136259 349/54 |
| 2008/0024691 A1* | 1/2008 | Okabe | G02F 1/13624 349/54 |
| 2009/0057671 A1* | 3/2009 | Ryu | G02F 1/133514 257/59 |
| 2010/0026923 A1* | 2/2010 | Chen | G02F 1/136259 349/55 |
| 2014/0014962 A1* | 1/2014 | Arai | H01L 33/0041 257/59 |
| 2015/0309379 A1* | 10/2015 | Yao | G02F 1/136259 257/72 |

* cited by examiner

DISPLAY DEVICE AND METHOD OF MANUFACTURING THE SAME

CROSS-REFERENCE TO RELATED APPLICATION

This application claims priority from and the benefit of Korean Patent Application No. 10-2015-0103902, filed on Jul. 22, 2015, which is incorporated by reference for all purposes as if fully set forth herein.

BACKGROUND

Field

Exemplary embodiments relate to a display device, and, more particularly, to a display device including a liquid crystal layer disposed between display substrates.

Discussion

Display devices visually display data. Examples of display devices include liquid crystal displays (LCDs), electrophoretic displays (EPDs), electrowetting displays (EWDs), organic light-emitting displays (OLEDs), inorganic electroluminescent displays (ELDs), field emission displays (FEDs), surface-conduction electron-emitter displays (SEDs), plasma displays (PDs), cathode ray tube (CRT) displays, and the like.

Of the above-noted display devices, LCDs are widely used. A conventional LCD typically includes a pair of display panels having electric field generating electrodes, such as pixel electrodes and a common electrode, and a liquid crystal layer disposed between the display panels. Switching devices selectively provide voltages to at least the pixel electrodes for driving the liquid crystal layer. If source and drain electrodes of a switching device are not properly patterned, driving failure of the switching device may occur, and, as a result, a hot pixel or a dead pixel may be generated.

The human eye is more sensitive to, and, therefore, can more easily recognize, a hot pixel (e.g., a "bright dot" defect) in a dark state of an LCD than a dead pixel (e.g., a "dark dot" defect) in a bright state of an LCD. As such, stricter design criteria govern hot pixels than dead pixels during a pass/fail test for a liquid crystal panel. A method, however, is needed to minimize panel defects caused by hot pixels. A laser repair method may be utilized to transform a hot pixel into a dead pixel; however, radicals may be generated in a pixel to be repaired as a result of intense energy from laser light applied during the laser repair process. The intense energy may cause a chain reaction with materials of a color filter layer and/or a liquid crystal layer in a display panel. As a result, the voltage holding ratio (VHR) may decrease not only in the pixel to be repaired, but also in one or more neighboring pixel regions. Decreases in the VHR may cause decreases in the luminance of the LCD.

The above information disclosed in this Background section is only for enhancement of understanding of the background of the inventive concept, and, therefore, it may contain information that does not form the prior art that is already known in this country to a person of ordinary skill in the art.

SUMMARY

One or more exemplary embodiments provide a display device configured to facilitate laser repair of a pixel without (or at least reducing the potential of) affecting a neighboring pixel.

One or more exemplary embodiments provide a laser repair method that, during the laser repair of a pixel, may reduce decreases in the voltage holding ratio (VHR) of one or more neighboring pixel regions.

Additional aspects will be set forth in the detailed description which follows, and, in part, will be apparent from the disclosure, or may be learned by practice of the inventive concept.

According to one or more exemplary embodiments, a display device includes: a substrate; a gate line disposed on the substrate and extending in a first direction; a data line insulated from the gate line and extending in a second direction intersecting the first direction; a pixel electrode disposed in a pixel region defined by the gate line and the data line; a source electrode connected to the data line; a drain electrode spaced apart from the source electrode; and a color filter layer disposed on the data line, the source electrode, and the drain electrode. The color filter layer includes: a first contact hole exposing the drain electrode, and a second contact hole disposed over at least one of the source electrode and the drain electrode. The pixel electrode is disposed on the color filter layer and is connected to the drain electrode through the first contact hole.

According to one or more exemplary embodiments, a method of fabricating an array substrate includes: forming a signal electrode on a substrate; forming color filters on the signal electrode; forming a cutting pattern including a first contact hole disposed over a portion of the signal electrode, and a second contact hole; and forming a transparent metal layer on the color filters.

According to one or more exemplary embodiments, a display device includes: an array substrate; an opposite substrate disposed on the array substrate, the opposite substrate including a common electrode; and a liquid crystal layer disposed between the array substrate and the opposite substrate. The array substrate includes: a gate electrode; an insulating layer disposed on the gate electrode; a source electrode disposed on the insulating layer; a drain electrode disposed on the insulating layer, the drain electrode being spaced apart from the source electrode; a sustain electrode disposed in a same layer as the gate electrode, the insulating layer being disposed between the sustain electrode and the drain electrode; and a pixel electrode disposed on the drain electrode, the pixel electrode being electrically connected to the drain electrode through a contact hole. The sustain electrode is welded to the pixel electrode at a welding point to form a dead pixel.

According to one or more exemplary embodiments, it is possible to minimize (or at least reduce) a decrease in luminance not only in a pixel to be repaired, but also in a neighboring pixel region, after laser repair of the pixel. To this end, it is also possible to minimize (or at least reduce) the presence of defective pixels in a display device. Additionally, it is possible to increase the efficiency of laser repair without additional processes, however, it is contemplated that additional processes may be utilized in association with exemplary embodiments described herein.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
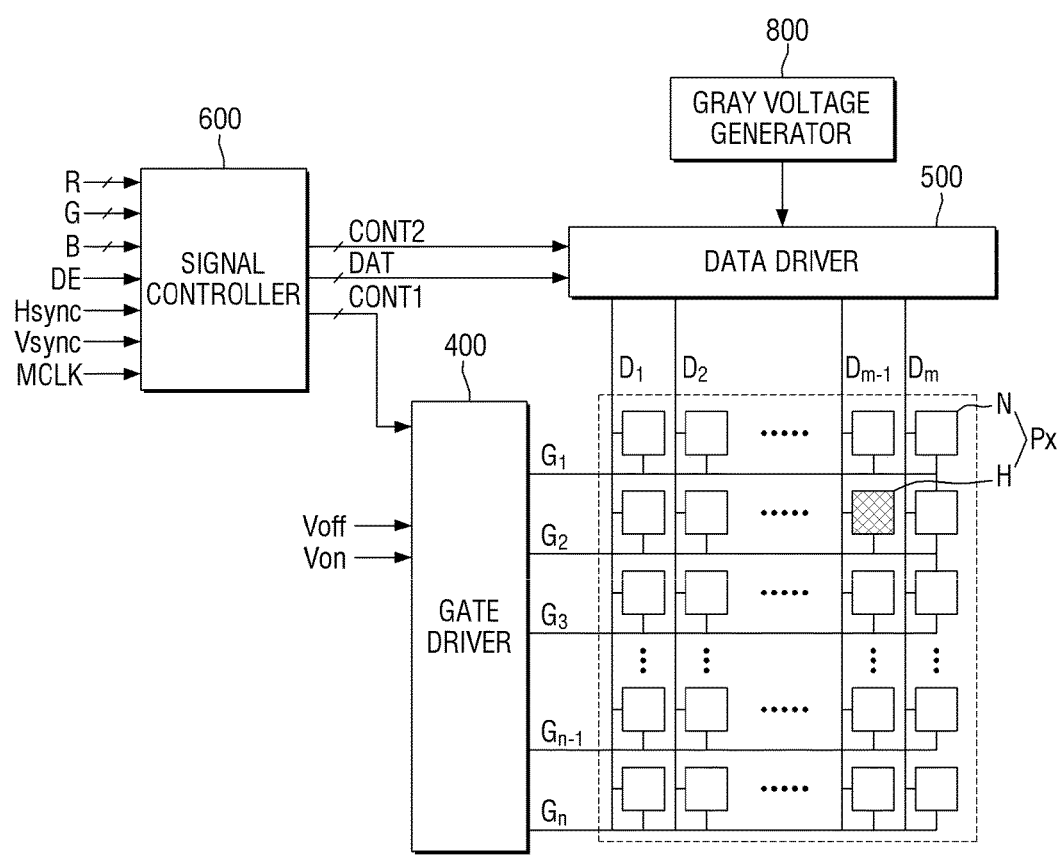
FIG. 1 is a block diagram of a liquid crystal display (LCD), according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
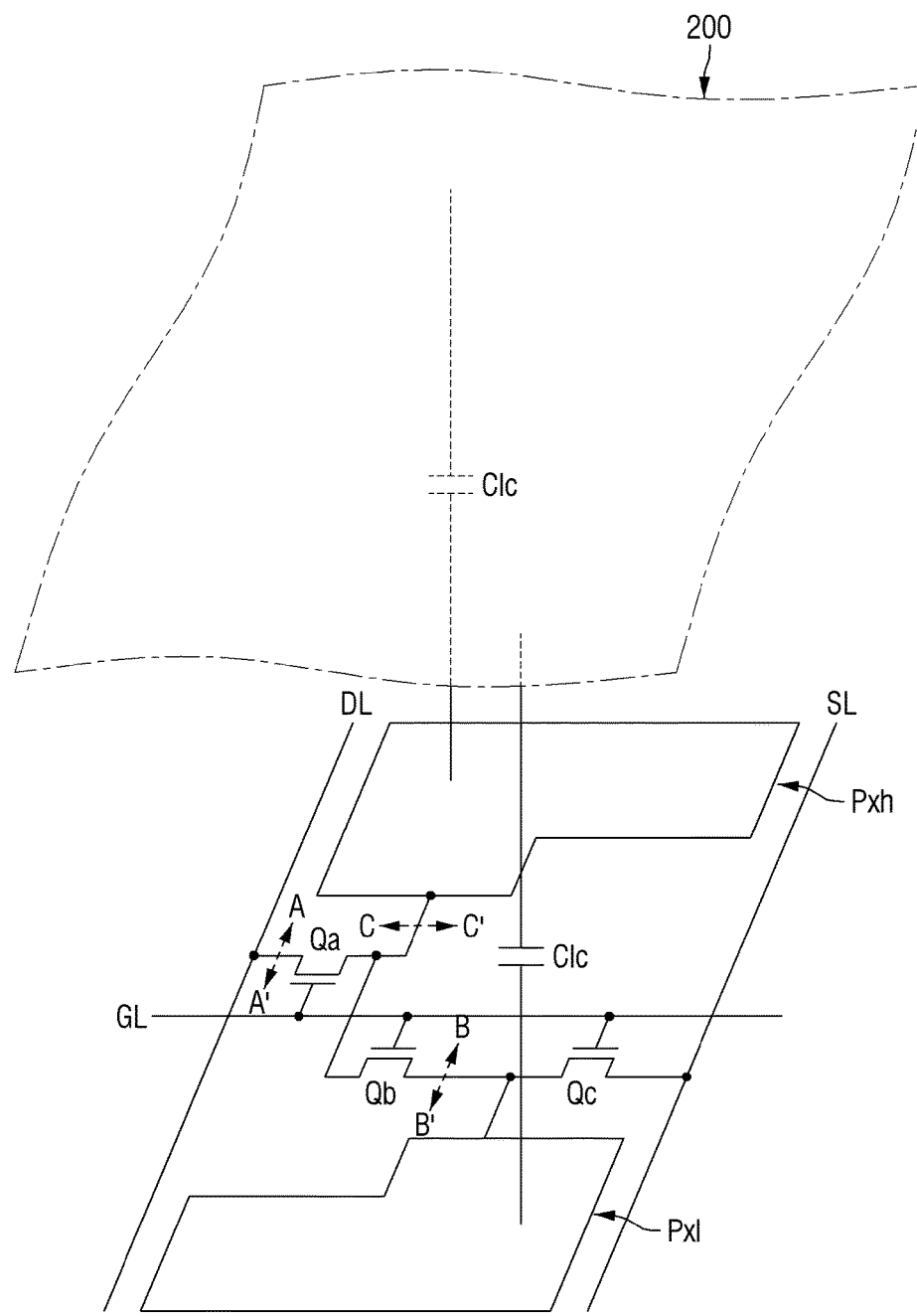
FIG. 2 is a schematic of an equivalent circuit structure of a pixel of the LCD of FIG. 1, according to one more exemplary embodiments.

FIG. 1 is a block diagram of a liquid crystal display (LCD), according to one or more exemplary embodiments. FIG. 2 is a schematic view of an equivalent circuit structure of a pixel of the LCD of FIG. 1, according to one or more exemplary embodiments.

Referring to FIGS. 1 and 2, an LCD may include a display panel 3, a gate driver 400, a data driver 500, a signal controller 600, and a gray voltage generator 800. Although specific reference will be made to this particular implementation, it is also contemplated that the LCD may embody many forms and include multiple and/or alternative components.

The signal controller 600 may receive an image signal (R, G, and B) and control signals including a data enable signal DE, horizontal and vertical synchronization signals Hsync and Vsync, and a clock signal MCLK from a host (not illustrated). The host may be internal or external to the LCD. The signal controller 600 may output a data control signal CONT2 and an image data signal DAT to the data driver 500, and may output a gate control signal CONT1 for selecting one of a plurality of gate lines $G_1$ through $G_n$ to the gate driver 400.

The gray voltage generator 800 may generate either all gray voltages to be supplied to pixels Px or a limited number of gray voltages (hereinafter, collectively referred to as "reference gray voltages"). The reference gray voltages may include gray voltages having a different polarity from a common voltage Vcom.

The data driver 500 may receive the reference gray voltages from the gray voltage generator 800 and may output gray voltages to a plurality of data lines $D_1$ through $D_m$ in response to receipt of the data control signal CONT2 and the image data signal DAT from the signal controller 800. When the gray voltage generator 800 provides only a limited number of reference gray voltages, the data driver 500 may divide the reference gray voltages to generate a larger number of extended gray voltages. The data driver 500 may perform an inversion driving method in which two gray voltages having the same difference from the common voltage Vcom, but having different polarities from each other are alternately applied to the pixels Px on a frame-by-frame basis.

The gate driver 400 may sequentially output gate signals to the gate lines $G_1$ through $G_n$ in response to the gate control signal CONT1. The gate signals include a gate-on voltage (or signal) Von for turning on thin-film transistors (TFTs) connected to a selected gate line and a gate-off voltage (or signal) Voff for turning off TFTs connected to the other non-selected gate lines.

The display panel 3 may include an array substrate 100, an opposite substrate 200 facing the array substrate 100, and a liquid crystal layer 300 disposed between the array substrate 100 and the opposite substrate 200. The array substrate 100 may include the pixels Px, which may be arranged in a matrix of columns and rows, the gate lines $G_1$ through $G_n$, which may be respectively connected to the rows of pixels Px, and the data lines $D_1$ through $D_m$, which may be respectively connected to the columns of pixels Px. Each of the pixels Px may be divided into a pair of first and second sub-pixels Pxh and Pxl, which may be spaced apart from each other. First and second sub-pixel electrodes may be disposed in the first and second sub-pixels Pxh and Pxl, respectively. Each of the first and second sub-pixels Pxh and Pxl may include a liquid crystal capacitor Clc and a sustain capacitor Cst (not shown).

A liquid crystal capacitor Clc may also be provided in the liquid crystal layer 300, which is disposed between the opposite substrate 200 and the first and second sub-pixels Pxh and Pxl on the array substrate 100. The liquid crystal layer 300 may serve as a liquid crystal capacitor Clc for storing an electric field generated between the first sub-pixel Pxh and the opposite substrate 200 and an electric field generated between the second sub-pixel Pxl and the opposite substrate 200. When pixels Px represent different gray levels, as illustrated in FIG. 2, the first sub-pixel Pxh may be a sub-pixel representing a relatively high gray level, and the second sub-pixel Pxl may be a sub-pixel representing a relatively low gray level.

The first sub-pixel Pxh may include a first switching device. The second sub-pixel Pxl may include second and third switching devices. Each of the first, second, and third switching devices may include a thin-film transistor (TFT) having a control terminal (or a gate electrode), an input terminal (or a source electrode), and an output terminal (or a drain electrode). In the description that follows, it is assumed that the first, second, and third switching devices are first, second, and third TFTs Qa, Qb, and Qc.

The first TFT Qa may be connected to a gate line GL and a data line DL. The second TFT Qb may be connected to the gate line GL and the output terminal of the first TFT Qa. The third TFT Qc may be connected to the gate line GL and the output terminal of the second TFT Qb. The control (or gate) terminal 120 of the first TFT Qa may be connected to (or otherwise formed as part of) the gate line GL, the input terminal of the first TFT Qa may be connected to the data line DL, and the output terminal of the first TFT Qa may be connected to a first end of the liquid crystal capacitor Clc by way of the pixel electrode of the first sub-pixel Pxh. The control (or gate) terminal 120 of the second TFT Qb may be connected to (or otherwise formed as part of) the gate line GL, the input terminal of the second TFT Qb may be connected to the data line DL, and the output terminal of the second TFT Qb may be connected to the first end of the liquid crystal capacitor Clc by way of the pixel electrode of the first sub-pixel Pxh and the input terminal of the third TFT Qc. The control (or gate) terminal 121 of the third TFT Qc may be connected to (or otherwise formed as part of) the gate line GL, the input terminal of the third TFT Qc may be connected to the second TFT Qb, and the output terminal of the third TFT Qc may be connected to a storage line SL, which may be applied with a sustain voltage Vcst.

In response to the gate-on voltage Von being applied to the gate line GL, the first, second, and third TFTs Qa, Qb, and Qc, which are connected to the gate line GL, may be turned on. In this manner, a data voltage applied to the data line DL may be applied to the first sub-pixel Pxh through the first TFT Qa that is turned on. In response to the second and third TFTs Qb and Qc being turned on, a divided voltage obtained from the data voltage and the sustain voltage Vcst may be applied to the second sub-pixel Pxl. In response to the sustain voltage Vcst being lower than the data voltage, the voltage applied to the second sub-pixel Pxl may be lower than the data voltage. To this end, the voltage that the liquid crystal capacitor Clc of the second sub-pixel Pxl is charged with may be lower than the voltage that the liquid crystal capacitor Clc of the first sub-pixel Pxh is charged with. As a result, the angle at which liquid crystal molecules of the liquid crystal layer 300 may be tilted may vary from the first sub-pixel Pxh to the second sub-pixel Pxl, and luminance of the first and second sub-pixels Pxh and Pxl may be controlled differently.

The pixels Px of the LCD may include normal pixels N and a defective pixel H, as illustrated in FIG. 1. The defective pixel H may be a dead pixel obtained by a repair process. For example, if a defect, such as a short circuit occurs in some of the first, second, and third TFTs Qa, Qb, and Qc of a pixel during the manufacture of an LCD, the pixel may display a dark color if it is a normal pixel. However, a pixel connected to a defective TFT, i.e., a defective pixel, may become a hot pixel displaying a bright color. Since the human eye is more sensitive to, and, therefore, can more easily recognize a hot pixel in a dark state of the LCD than a dead pixel in a bright state of the LCD, performance of a repair process to transition the hot pixel into a dead pixel may increase the display quality of the LCD.

To transform the defective pixel H into a dead pixel, laser light may be applied to the defective pixel H to cut the defective pixel H. Cutting the defective pixel H prevents a data voltage from being applied to the data line DL to which the defective pixel H is connected from being received by the defective pixel H. To transform the defective pixel H into a dead pixel, the defective pixel H may be cut along one or more of cutting lines A-A', B-B' and C-C', as illustrated in FIG. 2. It is noted, however, that intense energy from the laser light may cause the deformation of the material of a color filter layer in the display panel 3.

Figure 3:
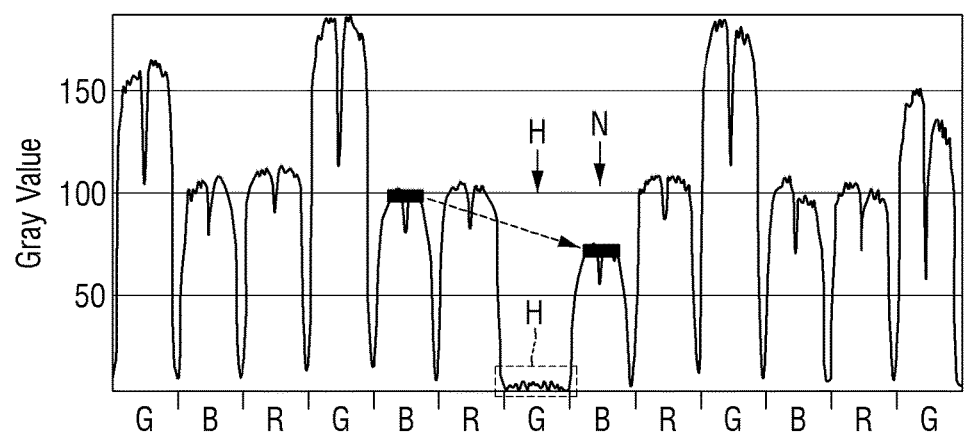
FIG. 3 is a graph of luminance obtained from pixels of a conventional LCD after radiation of laser light to a defective pixel of the conventional LCD.

FIG. 3 is a graph of luminance obtained from pixels of a conventional LCD after radiation of laser light to a defective pixel of the conventional LCD.

Referring to FIG. 3, in response to the defective pixel H being transformed into a dead pixel through the radiation of laser light, the luminance of the defective pixel H becomes close to zero, but the luminance of an adjacent normal pixel N is also changed. Experimental results show that, in response to laser light being applied to a pixel G, where a green color filter is located, the luminance of a neighboring pixel R or B, where a red color filter or blue color filter, is located is changed. That is, the green color filter may contain a considerable amount of bromide (Br), and the reaction of Br with intense laser light may decompose the pigment of the green color filter and may, thereby, generate halogen elements. The halogen elements may be either ionized or serve as radicals, thereby contaminating liquid crystal molecules and causing the degradation of the luminance of a neighboring pixel. According to one or more exemplary embodiments, a false contact hole with a color filter removed therefrom may be provided at a location to which laser light for repair is to be allocated. This may prevent the deformation of a color filter by the laser light. The false contact hole will be described below in more detail.

The structure of pixels of illustrative LCDs will hereinafter be described in more detail with reference to FIGS. 4-17.

Figure 4:
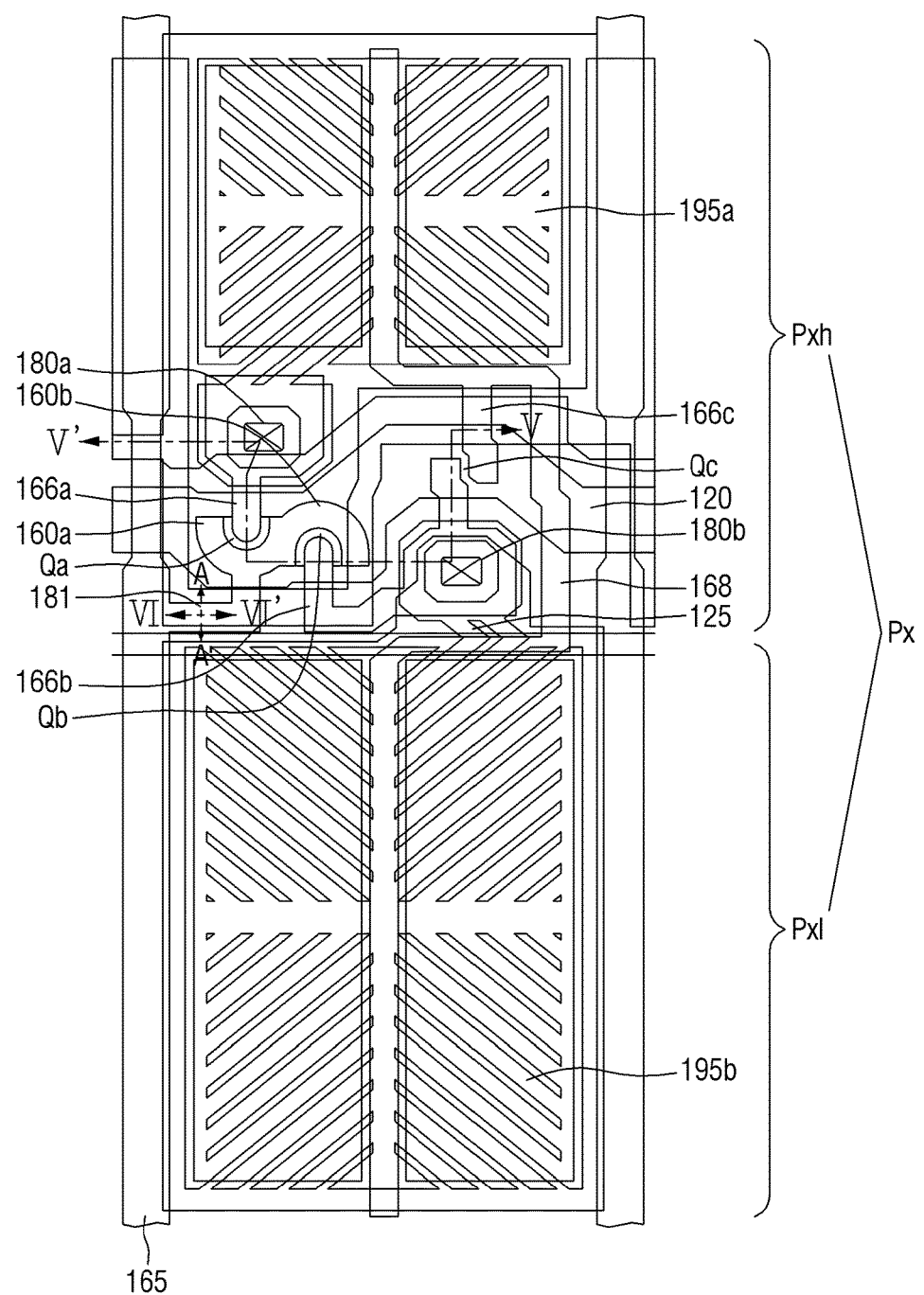
FIG. 4 is a layout view of a pixel of the LCD of FIG. 1, according to one or more exemplary embodiments.
Figure 5:
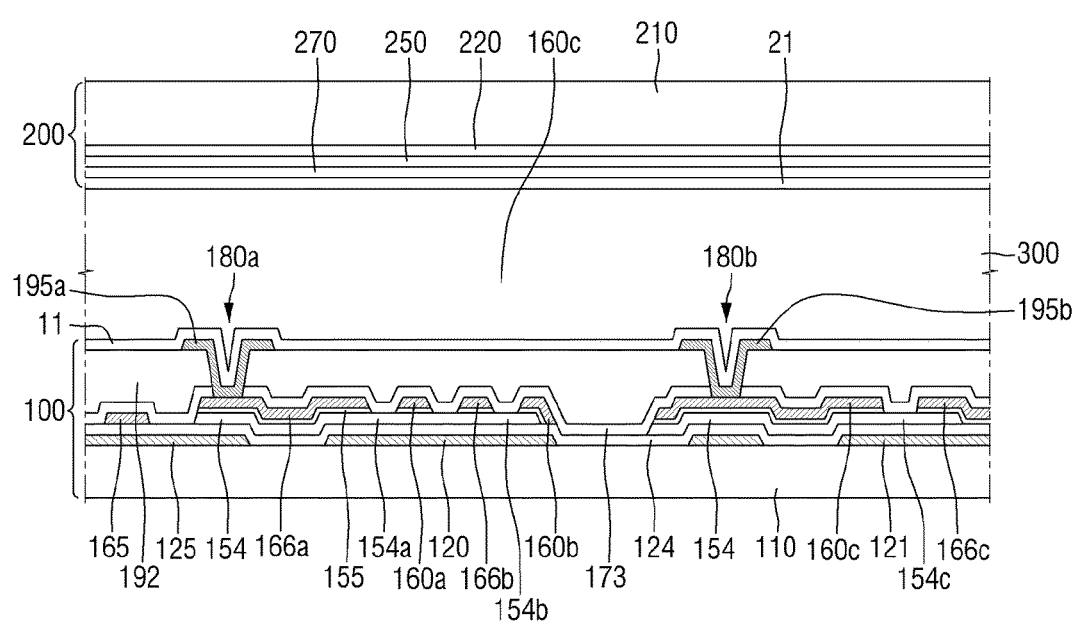
FIG. 5 is a cross-sectional view of the pixel of FIG. 4 taken along sectional line V-V' of FIG. 4, according to one or more exemplary embodiments.
Figure 6:
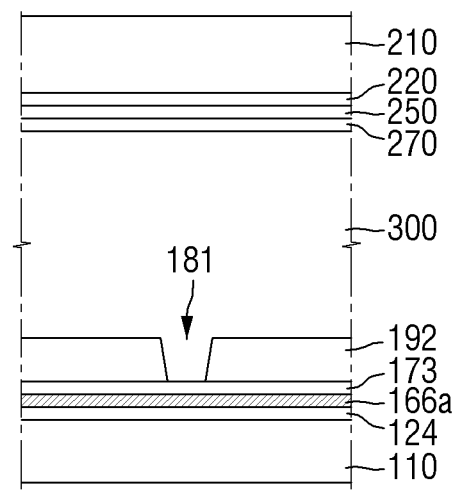
FIG. 6 is a cross-sectional view of the pixel of FIG. 4 taken along sectional line VI-VI' of FIG. 4, according to one or more exemplary embodiments.
Figure 7:
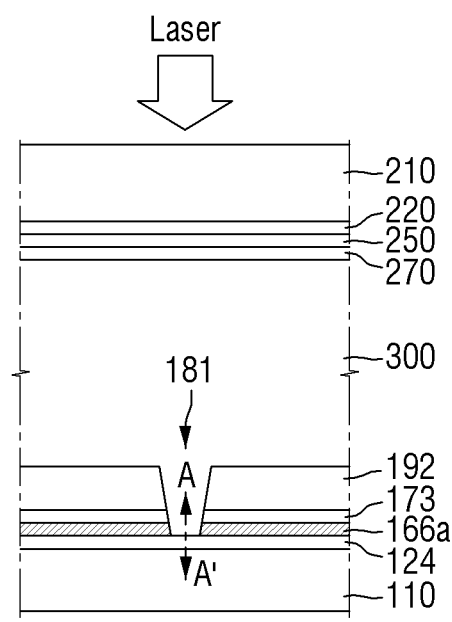
FIG. 7 is a cross-sectional view of a state of the pixel of FIG. 6 after laser repair has been performed on the pixel along a cutting line A-A', according to one or more exemplary embodiments.

FIG. 4 is a layout view of a pixel of the LCD of FIG. 1, according to one or more exemplary embodiments. FIG. 5 is a cross-sectional view of the pixel of FIG. 4 taken along sectional line V-V' of FIG. 4, whereas FIG. 6 is a cross-sectional view of the pixel of FIG. 4 taken along sectional line VI-VI' of FIG. 4. FIG. 7 is a cross-sectional view of a state of the pixel of FIG. 6 after laser repair has been performed on the pixel along cutting line A-A', according to one or more exemplary embodiments.

Referring to FIGS. 4 and 5, the array substrate 100 has a first insulating substrate 110 as a base substrate. The first insulating substrate 110 may contain an insulating material, such as transparent glass, quartz, ceramic, silicon, transparent plastic, etc. It is contemplated, however, that any suitable material may be utilized as the first insulating substrate 110.

The gate line GL may be disposed on the first insulating substrate 110. The gate line GL may contain an aluminum (Al)-based metal, such as Al or an Al alloy, a silver (Ag)-based metal, such as Ag or an Ag alloy, a copper (Cu)-based metal, such as Cu or a Cu alloy, a molybdenum (Mo)-based metal, such as Mo or a Mo alloy, chromium (Cr), tantalum (Ta), titanium (Ti), or a combination thereof. It is contemplated, however, that any suitable material may be utilized as the gate line GL. The gate line GL may have a single-layer structure or a multilayer structure including two or more conductive films (not illustrated) having different physical properties. The gate line GL may extend in a first direction (for example, a horizontal direction as illustrated in FIG. 4). The gate line GL may extend across a pixel Px along the boundary between first and second sub-pixels Pxh and Pxl of the pixel Px.

The first sustain electrode line 125 may be formed in the same layer as the gate line GL. The first sustain electrode line 125 may connect the pixel Px and a neighboring pixel in the first direction, and may be disposed parallel to the gate line GL. The first sustain electrode line 125 may be disposed between the first and second sub-pixels Pxh and Pxl of the pixel Px, and may be provided with the same sustain voltage as the storage line SL, i.e., the sustain voltage Vcst.

A gate insulating layer 124 is disposed between the gate line GL and the first sustain electrode line 125. The gate insulating layer 124 may be formed of, for example, silicon nitride ($SiN_x$), silicon oxide ($SiO_2$), silicon oxynitride (SiON), or a composition layer thereof. It is contemplated, however, that any suitable material may be utilized in association with gate insulating layer 124.

A semiconductor layer 154 is disposed on the gate insulating layer 124. The semiconductor layer 154 may be formed of, for example, hydrogenated amorphous silicon or polycrystalline silicon. It is contemplated, however, that any suitable material may be utilized in association with semiconductor layer 154. The semiconductor layer 154 may have various shapes, such as an island or linear shape. As seen in FIGS. 4 and 5, the semiconductor layer 154 may have a linear shape. The semiconductor layer 154 may overlap a data wire (DL, 160a, 160b, 160c, 166a, 166b, 166c, and SL), which will be described later, and may also be provided in spaces where source electrodes and respective drain electrodes face, and are spaced from each other. The semiconductor layer 154 includes a first channel region 154a, which is overlapped by a first source electrode 160a and a first drain electrode 166a, a second channel region 154b, which is overlapped by a second source electrode 160b and a second drain electrode 166b, and a third channel region 154c, which is overlapped by a third source electrode 160c and a third drain electrode 166c.

An ohmic contact layer 155, which is formed of n+ hydrogenated amorphous silicon doped with a high concentration of n-type impurities or silicide, may be disposed on the semiconductor layer 154. The ohmic contact layer 155 may be disposed between the semiconductor layer 154 and a layer of the first, second, and third source electrodes 160a, 160b, and 160c and the first, second, and third drain electrodes 166a, 166b, and 166c to reduce contact resistance therebetween. The ohmic contact layer 155, like the semiconductor layer 154, may have various shapes, such as an island shape or a linear shape. When the semiconductor layer 154 has an island shape, the ohmic contact layer 155 may also have an island shape, and when the semiconductor layer 154 has a linear shape, the ohmic contact layer 155 may also have a linear shape. In other words, the ohmic contact layer 155 may be shaped similarly to the semiconductor layer 154. The ohmic contact layer 155, unlike the semiconductor layer 154, may be disconnected (or removed) in the spaces where the first, second, and third source electrodes 160a, 160b, and 160c face and are spaced from the first, second, and third drain electrodes 166a, 166b, and 166c, respectively. In this manner, disconnects in the ohmic contact layer 155 may expose the semiconductor layer 154, which is disposed below the ohmic contact layer 155.

The data wire (DL, 160a, 160b, 160c, 166a, 166b, 166c, and SL) is disposed on the ohmic contact layer 155. The data wire (DL, 160a, 160b, 160c, 166a, 166b, 166c, and SL) may contain an Al-based metal, such as Al or an Al alloy, a Ag-based metal, such as Ag or an Ag alloy, a Cu-based metal, such as Cu or a Cu alloy, a Mo-based metal such as Mo or a Mo alloy, Cr, Ta, Ti, or a combination thereof. It is contemplated, however, that any suitable material may be utilized as the date wire (DL, 160a, 160b, 160c, 166a, 166b, 166c, and SL). The data wire (DL, 160a, 160b, 160c, 166a, 166b, 166c, and SL) may include the data line DL, a plurality of source electrodes, a plurality of drain electrodes, and the storage line SL. The data line DL extends in a second direction (for example, a vertical direction as illustrated in FIG. 4). The data line DL may be disposed to and extend between a pair of adjacent columns of pixels. The gate line GL and the data line DL may intersect each other to, thereby, define a pixel region.

The plurality of source electrodes include the first, second, and third source electrodes 160a, 160b, and 160c. The first source electrode 160a may protrude from the data line DL toward the first channel region 154a of the semiconductor layer 154. The second source electrode 160b may be connected to the first source electrode 160a and may protrude toward the second channel region 154b of the semiconductor layer 154. The third source electrode 160c may protrude from the second drain electrode 166b toward the third channel region 154c of the semiconductor layer 154.

The plurality of drain electrodes include the first, second, and third drain electrodes 166a, 166b, and 166c. The first drain electrode 166a may be spaced apart from the first source electrode 160a relative to the first channel region 154a of the semiconductor layer 154. The first drain electrode 166a may be connected to a first sub-pixel electrode 195a, which is disposed above the first drain electrode 166a, through a first contact hole 180a. The second drain electrode 166b may be spaced apart from the second source electrode 160b relative to the second channel region 154b of the semiconductor layer 154. The third drain electrode 166c may be spaced apart from the third source electrode 160c relative to the third channel region 154c of the semiconductor layer 154. The second drain electrode 166b and the third source electrode 160c may be electrically connected to each other. For example, the second drain electrode 166b and the third source electrode 160c may be formed in one body.

The gate line GL, the first source electrode 160a, and the first drain electrode 166a may form a first TFT Qa along with the first channel region 154a of the semiconductor layer 154. The gate line GL, the second source electrode 160b, and the second drain electrode 166b may form a second TFT Qb along with the second channel region 154b of the semiconductor layer 154. The gate line GL, the third source electrode 160c, and the third drain electrode 166c may form a third TFT Qc along with the third channel region 154c of the semiconductor layer 154.

The storage line SL may extend substantially parallel to the data line DL in the second direction. Part of the storage line SL may be connected to the third drain electrode 166c. The storage electrode 125 may be disposed adjacent to the gate line GL, and may be provided inside the pixel Px, e.g., within a region disposed between adjacent data lines DL, such as a region disposed between outermost lateral edges of the first and second sub-pixel electrodes 195a and 195b. The storage electrode 125 may include a portion extending parallel to the gate line GL and a portion disposed along the boundary between the first sub-pixel electrode 195a and the second sub-pixel electrode 195b.

A passivation layer 173 is disposed on the data wire (DL, 160a, 160b, 160c, 166a, 166b, 166c, and SL) and an exposed portion of the semiconductor layer 154. The first contact hole 180a and a second contact hole 180b may be formed on the passivation layer 173 to at least partially expose the first, second, and third drain electrodes 166a, 166b, and 166c. The passivation layer 173 may contain, for example, an inorganic material, such as silicon nitride or silicon oxide, a material formed by plasma enhanced chemical vapor deposition (PECVD), such as a-Si:C:O or a-Si:O:F, or an organic material. The passivation layer 173 is illustrated in FIGS. 5 to 7 as being a single layer, but a stack of a plurality of films may be used as the passivation layer 173. For example, the passivation layer 173 may include a lower inorganic film formed of an inorganic material and an upper organic film formed of an organic material.

A color filter 192 may be disposed on the passivation layer 173 for the pixel Px. The color filter 192 may display one of, for instance, three primary colors, e.g., red, green, and blue. It is contemplated, however, that any other or additional suitable color may be utilized in association with exemplary embodiments described herein. Color filters of the same color may be disposed in the first and second sub-pixels Pxh and Pxl as the color filter 192, but color filters of different colors may be disposed in the pixel Px and a neighboring pixel (not shown). The color filter 192 may be disposed in such a manner that the three primary colors may be sequentially repeated in rows and columns. Any other suitable arrangement may be utilized in association with exemplary embodiments described herein.

A pixel electrode (195a and 195b) is disposed on the color filter 192. The pixel electrode (195a and 195b) may be formed of a transparent conductive material, such as aluminum zinc oxide (AZO), gallium zinc oxide (GZO), indium tin oxide (ITO), indium zinc oxide (IZO), etc. It is also contemplated that one or more conductive polymers (ICP) may be utilized, such as, for example, polyaniline (PANT), poly(3,4-ethylenedioxythiophene) poly(styrenesulfonate)

(PEDOT:PSS), etc. The pixel electrode (195a and 195b) includes the first and second sub-pixel electrodes 195a and 195b. The first sub-pixel electrode 195a receives a data voltage transmitted by the first TFT Qa from the first drain electrode 166a through the first contact hole 180a. The second sub-pixel electrode 195b receives a data voltage transmitted by the second TFT Qb from the second drain electrode 166b through the second contact hole 180b.

As seen in FIG. 5, a first (e.g., lower) alignment layer 11 may be disposed on the pixel electrode (195a and 195b).

The opposite substrate 200 has a second insulating substrate 210 as a base substrate. The second insulating substrate 210, like the first insulating substrate 110, may contain an insulating material, such as transparent glass, quartz, ceramic, silicon, transparent plastic, etc. It is contemplated, however, that any suitable material may be utilized as the second insulating substrate 210.

A light-blocking pattern 220 may be disposed on the second insulating substrate 210. The light-blocking pattern 220 may be formed between the pixel Px and another pixel and may prevent different colors of light from being mixed. The light-blocking pattern 220 may be disposed in a non-display area to prevent light leakage. The light-blocking pattern 220 may be formed of any suitable material that can block the transmission of incident light. A light-blocking effect may be realized by reflecting or absorbing incident light. For example, the light-blocking pattern 220 may be formed of a metal having a high reflectance, such as Cr, to provide a light-blocking effect. Alternatively, the light-blocking pattern 220 may be formed as an organic film (or a black organic layer) comprising a material, such as a black dye or pigment, to absorb most of the light incident thereupon, and, thereby, to provide a light-blocking effect. It is also contemplated that the light-blocking pattern 220 may be formed as a stack of a metal film and a black organic film.

An overcoat layer 250 may be disposed on the light-blocking pattern 220. The overcoat layer 250 covers the light-blocking pattern 220 and may cover the entire (or substantially the entire) surface of the second insulating substrate 210. The overcoat layer 250 may remove a height difference generated by the light-blocking pattern 220 and may planarize the second insulating substrate 210. The overcoat layer 250 may be formed of a transparent organic film, however, any suitable material may be utilized in association with exemplary embodiments described herein.

A common electrode 270 is disposed on the overcoat layer 250. The common electrode 270 may be formed of a transparent metal, such as AZO, GZO, IZO, ITO, etc., but exemplary embodiments are not limited thereto. It is also contemplated that one or more ICPs may be utilized, such as, for example, PANT, PEDOT:PSS, etc. The common voltage Vcom is applied to the common electrode 270. An electric field may be formed by the common voltage Vcom of the common electrode 270 and a gray voltage of the pixel electrode (195a and 195b), and, as a result, liquid crystal molecules of the liquid crystal layer 300 may be rotated (or otherwise controlled). The luminance of the pixel varies depending on the degree to which the liquid crystal molecules are rotated.

An upper alignment layer 21 and the lower alignment layer 11 may be disposed in contact the liquid crystal layer 300. The upper alignment layer 21 may be disposed on the common electrode 270, and the lower alignment layer 11 may be disposed on the pixel electrode (195a and 195b). The upper and lower alignment layers 21 and 11 may be vertical alignment layers, however, any other suitable configurations may be utilized in association with exemplary embodiments described herein. The upper and lower alignment layers 21 and 11 may contain a photo-reactive material, such as reactive mesogens.

The liquid crystal layer 300 may be disposed between the array substrate 100 and the opposite substrate 200. The liquid crystal layer 300 may serve as a dielectric body. The liquid crystal layer 300 may include liquid crystal molecules with negative dielectric anisotropy, however, any suitably configured liquid crystal molecules may be utilized in association with exemplary embodiments described herein. The array substrate 100 and the opposite substrate 200 may be attached to each other by a sealing member (not shown). The sealing member may be formed along the sides of the array substrate 100 or the opposite substrate 200, and may couple the array substrate 100 and the opposite substrate 200 together. The liquid crystal layer 300 may be provided in the space formed by the array substrate 100, the opposite substrate 200, and the sealing member.

Polarizers (not illustrated) may be disposed on each of the array substrate 100 and the opposite substrate 200. Polarization axes or transmission axes of the polarizers may be orthogonal (or substantially orthogonal) to one another. The polarizers may be disposed above or below the opposite substrate 200 and above or below the array substrate 100. Alternatively, the polarizers may be formed only above or below one of the opposite substrate 200 and the array substrate 100. The polarizers may have a refractive index of about 1.5 to reduce the diffraction of external light, and may have a haze of about 2% to about 5%.

When the pixel Px is a hot pixel, the pixel Px may be transformed into a dead pixel by cutting signal electrodes or the pixel electrode (195a and 195b) of the pixel Px to prevent a gray voltage transmitted via the data line DL from being applied to the pixel electrode (195a and 195b). The signal electrodes include the first, second, and third source electrodes 160a, 160b, and 160c, and the first, second, and third drain electrodes 166a, 166b, and 166c. In this manner, by cutting the first, second, and third source electrodes 160a, 160b, and 160c or the first, second, and third drain electrodes 166a, 166b, and 166c, the pixel Px may be transformed into the dead pixel. The pixel Px may be cut along cutting lines A-A' or B-B' in order for both the first and second sub-pixel electrodes 195a and 195b not to not be able to be driven. During a laser cutting process, energy is transmitted to the signal electrodes through the color filter 192. It is noted that if no color filter 192 is disposed in a path of the laser, the laser cutting process may be facilitated. As such, a false contact hole 181 may be formed through the color filter 192 to expose a signal electrode, which will be described in more detail in the proceeding paragraphs.

FIG. 6 is a cross-sectional view of the pixel of FIG. 4 taken along sectional line VI-VI' of FIG. 4, according to one or more exemplary embodiments. FIG. 7 is a cross-sectional view of a state of the pixel of FIG. 6 after laser repair has been performed on the pixel along a cutting line A-A', according to one or more exemplary embodiments. In this manner, FIGS. 6 and 7 illustrate false contact hole 181.

In response to the first source electrode 160a being cut, no data voltage is provided to both the second and third source electrodes 160b and 160c. The sustain voltage Vcst, which is applied to the storage line SL, is similar to the common voltage Vcom and is, thus, unable to drive the liquid crystal layer 300. This is because an electric field corresponding to the difference in voltage between the array substrate 100 and the opposite substrate 200 is formed in the liquid crystal layer 300. Cutting line A-A' may be a line extending across the first source electrode 160a, which is branched off from the data line DL. Cutting line A-A' may be formed in the second direction, which is perpendicular to the first direction, e.g., the direction in which the first source electrode 160a is branched off from the data line DL. The length of cutting line A-A' may be greater than or the same as a dimension (e.g., the length or the width) of the first source electrode 160a.

In association with a laser repair process, laser light is radiated to completely cut the first source electrode 160a. In this manner, cutting of the first source electrode 160a prevents the transmission of a signal through the first source electrode 160a. When the color filter 192 is disposed on the first source electrode 160a, the laser light must pass through the color filter 192 first to arrive at the first source electrode 160a. However, if the color filter 192 is formed of a green pigment, the liquid crystal layer 300 may be contaminated by the color filter 192, as described above with reference to FIG. 3. Accordingly, as illustrated in FIG. 6, the false contact hole 181, which is similar to a real contact hole, may be provided in a part of the color filter 192 where cutting line A-A' may be formed. It is noted that the false contact hole 181 may be formed on, and, thereby, exposing a portion of the passivation layer 173 disposed over a portion of the source electrode 160a including cutting line A-A'. The first contact hole 181 may have a size capable of including cutting line A-A'. If the pixel of FIG. 6 is a defective pixel, such as a hot pixel, laser repair may be performed to cut the first source electrode 160a along the cutting line A-A', as illustrated in FIG. 7.

Figure 8:
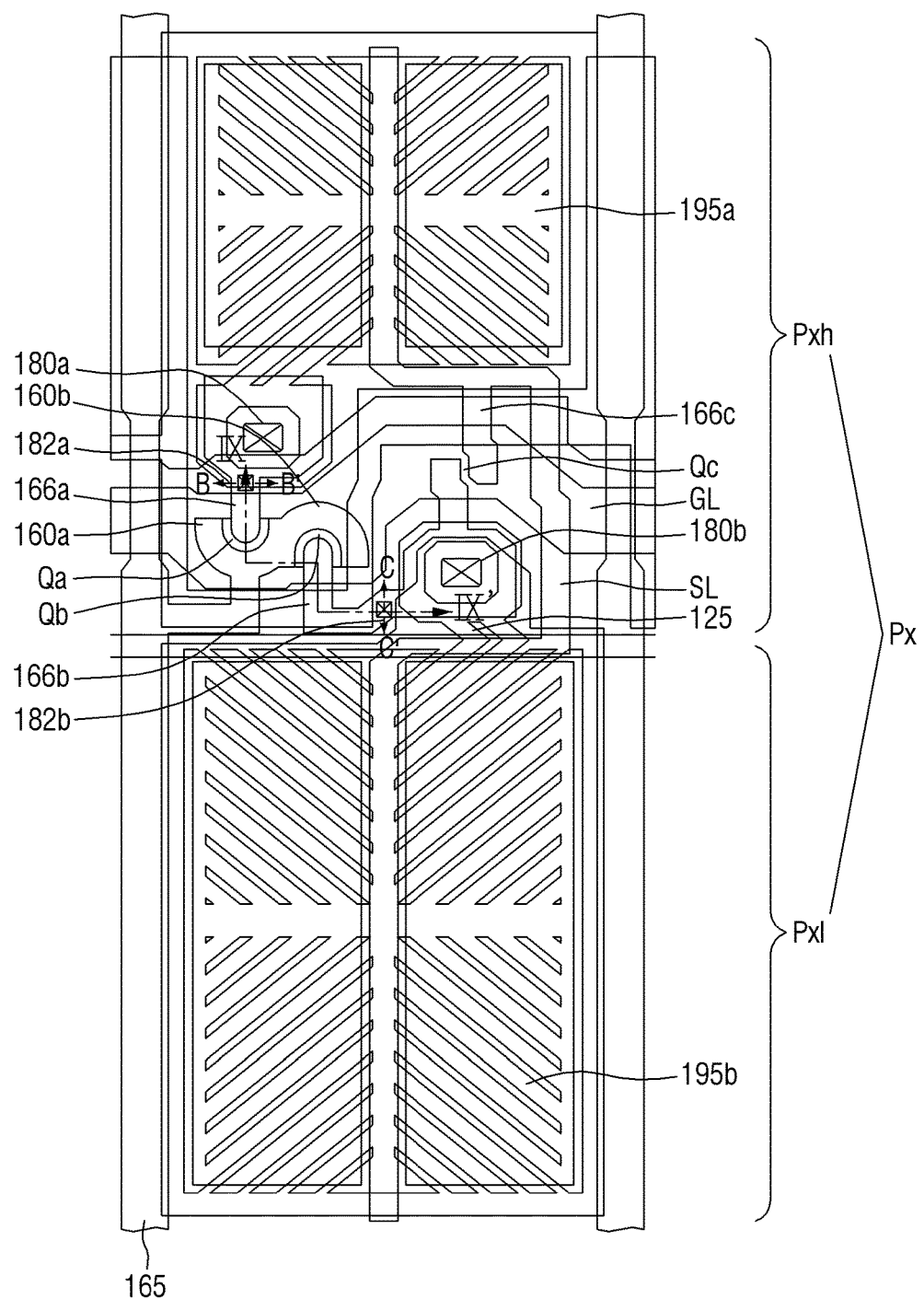
FIG. 8 is a layout view of a pixel of an LCD, according to one or more exemplary embodiments.
Figure 9:
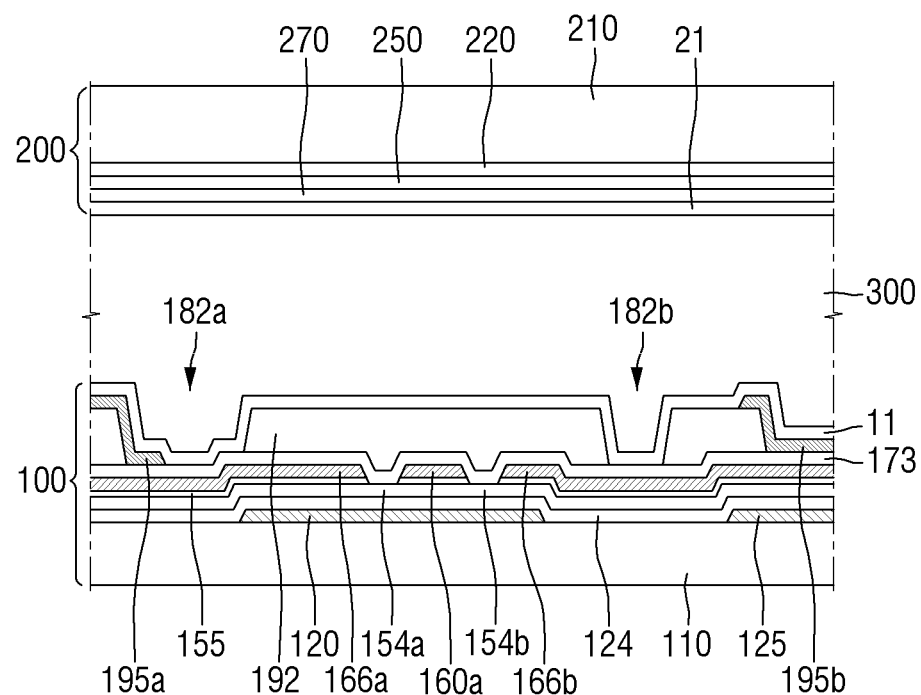
FIG. 9 is a cross-sectional view of the pixel of FIG. 8 taken along sectional line IX-IX' of FIG. 8, according to one or more exemplary embodiments.
Figure 10:
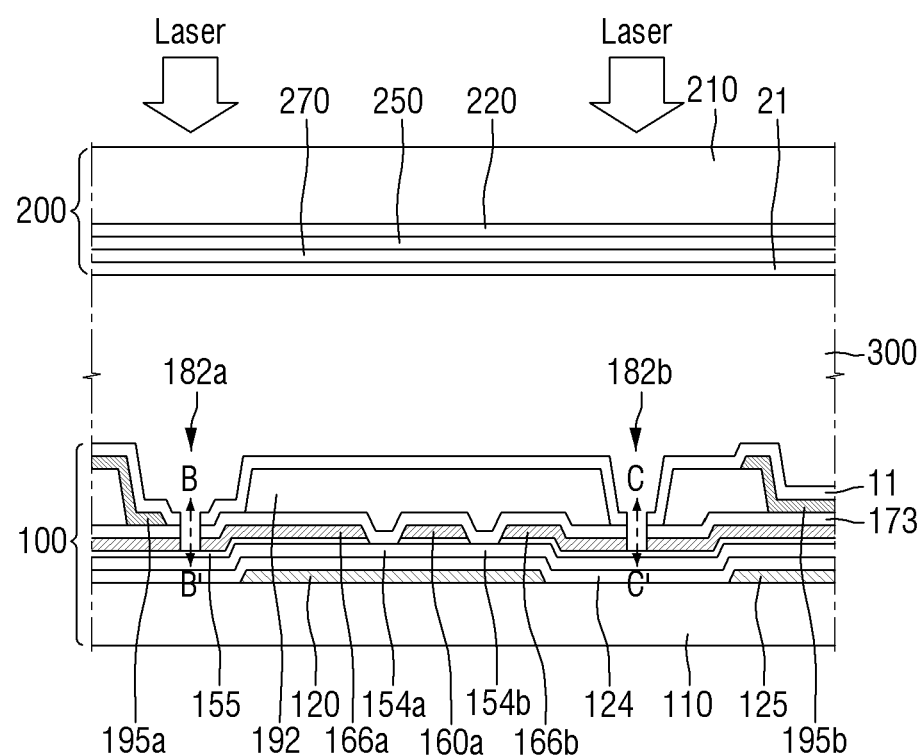
FIG. 10 is a cross-sectional view of a state of the pixel of FIG. 9 after laser repair has been performed on the pixel along cutting lines B-B' and C-C', according to one or more exemplary embodiments.

FIG. 8 is a layout view of a pixel of an LCD, according to one or more exemplary embodiments. FIG. 9 is a cross-sectional view of the pixel of FIG. 8 taken along sectional line IX-IX' of FIG. 8. FIG. 10 is a cross-sectional view of a state of the pixel of FIG. 9 after laser repair has been performed on the pixel along cutting lines B-B' and C-C', according to one or more exemplary embodiments. The pixels of FIGS. 8-10 are substantially similar to the pixels of FIGS. 4-7, and, therefore, to avoid obscuring exemplary embodiments described herein, duplicative descriptions have been avoided. The pixel of FIG. 8 includes first and second false contact holes 182a and 182b formed along cutting lines B-B' and C-C', respectively.

Referring to FIG. 8, the first false contact hole 182a is disposed above a first drain electrode 166a, and the second false contact hole 182b is disposed above a second drain electrode 166b. Even if a first source electrode 160a is not completely cut during a laser repair process for transforming a hot pixel into a dead pixel, no data voltage may be transmitted to a pixel electrode (195a and 195b) if the first and second drain electrodes 166a and 166b are cut.

The first and second false contact holes 182a and 182b may be formed in a color filter 192 in the form of holes, and, as a result, the first and second contact holes 182a and 182b may be disposed over respective portions of the first and second drain electrodes 166a and 166b, as illustrated in FIGS. 8 and 9. Since a light-blocking pattern 220 is formed on parts of an opposite substrate 200 corresponding to the first and second false contact holes 182a and 182b, any difference in luminance caused by a height difference may not be perceivable to an observer of the associated LCD.

The length of cutting line B-B' may be greater than or the same as the width of the first drain electrode 166a, and the length of cutting line C-C' may be greater than or the same as the width of the second drain electrode 166b. Cutting line B-B' may be formed on the first drain electrode 166a in a first direction, which is perpendicular to a second direction in which the first drain electrode 166a extends toward a first channel region 154a, and cutting line C-C' may be formed on the second drain electrode 166b in the second direction, which is perpendicular to the first direction, e.g., a direction in which the second drain electrode 166b extends. The first false contact hole 182a may have a size including cutting line B-B', and the second false contact hole 182b may have a size including cutting line C-C'.

Referring to FIG. 10, a laser repair process for transforming a hot pixel into a dead pixel may be performed in association with both the first and second false contact holes 182a and 182b. The first and second false contact holes 182a and 182b, instead of the color filter 192, are provided over the first and second drain electrodes 166a and 166b. In this manner, laser light radiated during the laser repair process for cutting the first and second drain electrodes 166a and 166b so that the first and second drain electrodes 166a and 166b no longer apply a data voltage to first and sub-pixel electrodes 195a and 195b can reach the first and second drain electrodes 166a and 166b without interfacing with the color filter 192. In this manner, the color filter 192 is not formed in the first and second false contact holes 182a and 182b.

In response to the pixel of FIG. 9 being determined as a hot pixel, a laser repair process may be performed. Then, the first and second drain electrodes 166a and 166b may both be cut, as illustrated in FIG. 10, and may become unable to transmit a data voltage to the first and second sub-pixel electrodes 195a and 195b. As a result, the pixel of FIG. 9 may be transformed into a dead pixel.

Figure 11:
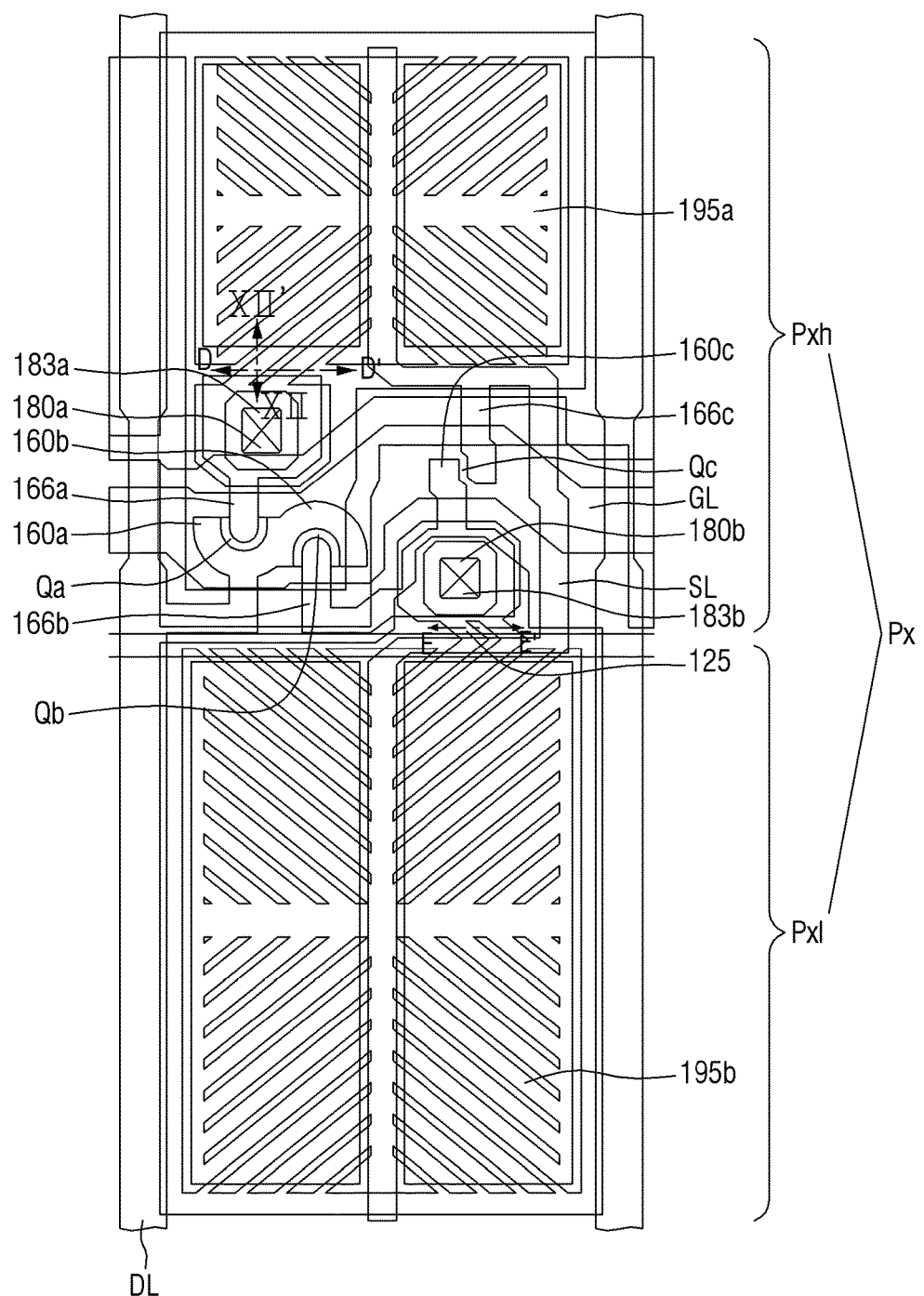
FIG. 11 is a layout view of a pixel of an LCD, according to one or more exemplary embodiments.
Figure 12:
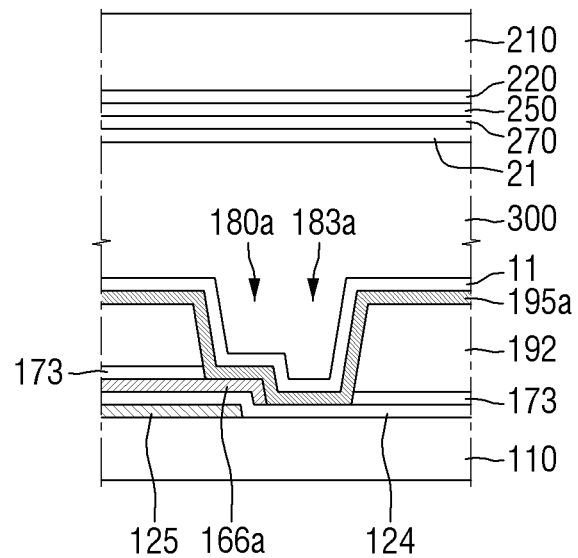
FIG. 12 is a cross-sectional view of the pixel of FIG. 11 taken along sectional line XII-XII' of FIG. 11, according to one or more exemplary embodiments.
Figure 13:
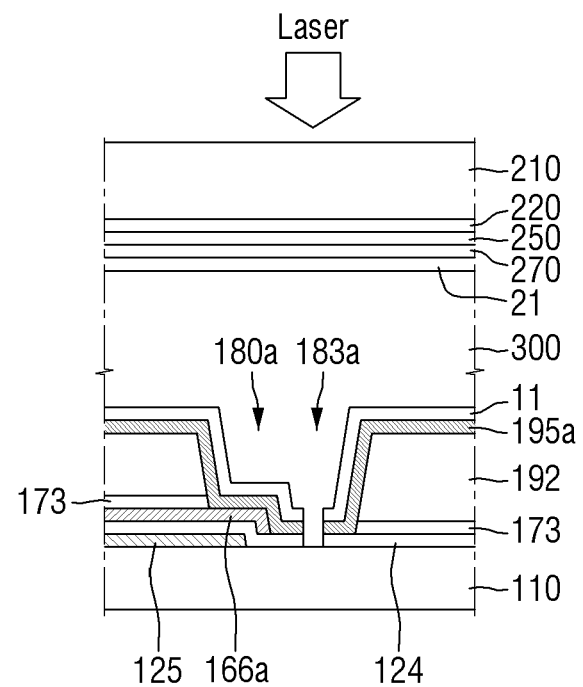
FIG. 13 is a cross-sectional view of a state of the pixel of FIG. 12 after laser repair has been performed on the pixel along cutting line D-D', according to one or more exemplary embodiments.

FIG. 11 is a layout view of a pixel of an LCD, according to one or more exemplary embodiments. FIG. 12 is a cross-sectional view of the pixel of FIG. 11 taken along sectional line XII-XII' of FIG. 11. FIG. 13 is a cross-sectional view of a state of the pixel of FIG. 12 after laser repair has been performed on the pixel, according to one or more exemplary embodiments. The pixels of FIGS. 11-13 are substantially similar to the pixels of FIGS. 4-7, and, therefore, to avoid obscuring exemplary embodiments described herein, duplicative descriptions have been avoided. The pixel of FIG. 11 includes third and fourth false contact holes 183a and 183b.

Referring to FIGS. 11 through 13, a laser repair process may be performed by cutting first and second pixel electrodes 195a and 195b to prevent a data voltage from being applied to the first and second pixel electrodes 195a and 195b. The first and second pixel electrodes 195a and 195b are disposed on a color filter 192, which may be deformed due to energy generated during the laser repair process. Accordingly, the third and fourth false contact holes 183a and 183b may be formed by making first and second contact holes 180a and 180b extending further toward the first and second sub-pixel electrodes 195a and 195b, respectively. The third false contact hole 183a may be integrally formed, and may be in communication with the first contact hole 180a, and the fourth false contact hole 183b may be integrally formed, and may be in communication with the second contact hole 180b. The third and fourth false contact holes 183a and 183b may extend from the first and second contact holes 180a and 180b, respectively, to be disposed over the first and second sub-pixel electrodes 195a and 195b, respectively. In this manner the third and fourth false contact holes 183a and 183b may overlap the first and second sub-pixel electrodes 195a and 195b, respectively, but not overlap the first and second drain electrodes 166a and 166b, respectively.

As seen in FIGS. 11 through 13, the color filter 192 is provided in a pixel region (Pxh and Pxl), but the color filter 192 is not disposed in the third and fourth false contact holes 183a and 183b. To this end, the third and fourth false contact holes 183a and 183b are formed in a region where a light-blocking pattern 220 is provided on an opposite substrate 200, rather than in the pixel region (Pxh and Pxl), where an image is displayed. The first sub-pixel electrode 195a may be cut inside the third false contact hole 183a along a direction of cutting line D-D'. The second sub-pixel electrode 195b may be cut inside the fourth false contact hole 183b along a direction of cutting line E-E'. To transform a hot pixel into a dead pixel, the first sub-pixel electrode 195a is cut in the direction of cutting line D-D', and the second sub-pixel electrode 195b is cut in the direction of cutting line E-E'.

According to one or more exemplary embodiments, the false contact hole(s) 181, 182a and 182b, or 183a and 183b may be formed not only along a determined cutting line to include the determined cutting line therein, but also along a gate line GL. That is, the false contact hole(s) 181, 182a and 182b, or 183a and 183b may be formed over the gate line GL, conforming to the shape of the gate line GL. In this manner, the false contact hole(s) 181, 182a and 182b, or 183a and 183b may also be referred to as a false contact line.

Figure 14:
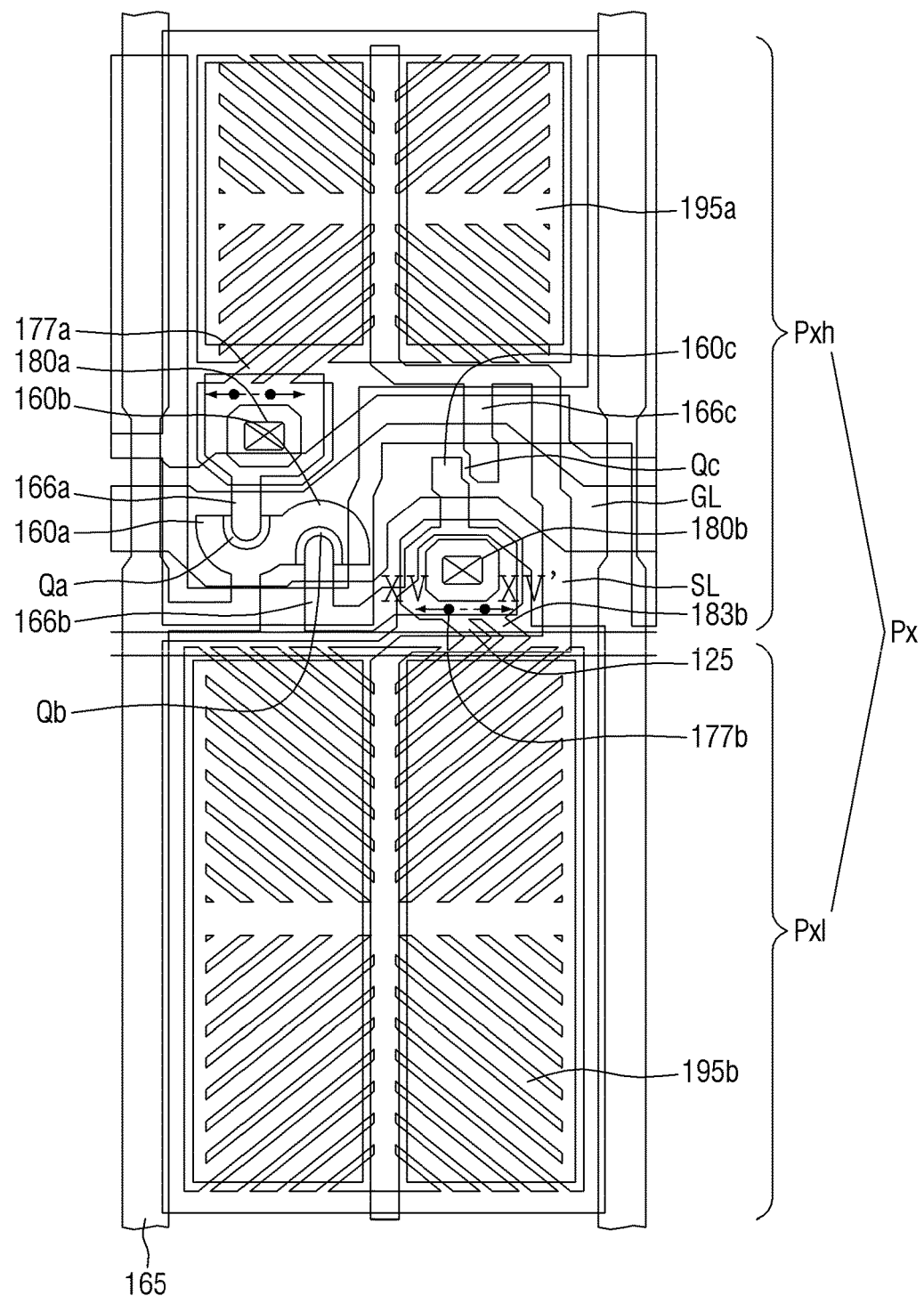
FIG. 14 is a layout view of a pixel of an LCD, according to one or more exemplary embodiments.
Figure 15:
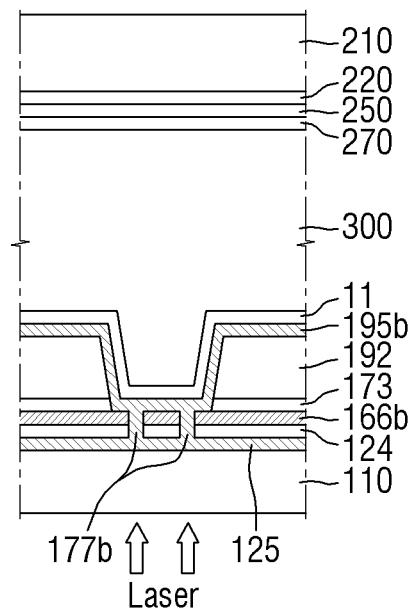
FIG. 15 is a cross-sectional view of a state of the pixel of FIG. 14 after welding has been performed on the pixel along a welding pattern, according to one or more exemplary embodiments.

FIG. 14 is a layout view of a pixel of an LCD, according to one or more exemplary embodiments. FIG. 15 is a cross-sectional view of the pixel of FIG. 14 taken along sectional line XV-XV' of FIG. 14. The pixel of FIGS. 14 and 15 are substantially similar to the pixels of FIGS. 4-7, and, therefore, to avoid obscuring exemplary embodiments described herein, duplicative descriptions have been avoided. The pixel of FIG. 14 includes welding patterns 177a and 177b for transforming (or otherwise converting) a hot pixel into a dead pixel.

Referring to FIGS. 14 and 15, to transform a hot pixel into a dead pixel, a pixel electrode 196 may be cut, or a pixel electrode (195a and 195b) may be welded together with sustain electrode line 125. Also, to transform a hot pixel into a dead pixel, short-wavelength laser light may be radiated from above an opposite substrate 200, or long-wavelength laser light may be radiated from below an array substrate 100.

In response to the sustain electrode line 125 and the pixel electrode (195a and 195b) being welded together by radiating long-wavelength laser light from below the array substrate 100, the pixel electrode (195a and 195b) may be short-circuited. When the sustain electrode line 125 and the pixel electrode (195a and 195b) are short-circuited, the pixel electrode (195a and 195b) is floated, and a sustain voltage Vest is applied to the pixel electrode (195a and 195b). Since the sustain voltage Vest is similar to a common voltage Vcom, liquid crystal molecules between the array substrate 100 and the opposite substrate 200 are not driven by the sustain voltage Vest, and, as a result, the luminance of the pixel of FIG. 14 does not change much. In this manner, the hot pixel of FIG. 14 may be transformed into a dead pixel.

The welding patterns 177a and 177b may be formed as close as possible to the sustain electrode line 125 to reduce the energy required for welding. For instance, the welding patterns 177a and 177b may be formed in contact holes 180a and 180b, respectively, in which the pixel electrode (195a and 195b) overlaps drain electrodes 166a and 166b. Since relatively thick layers, such as a gate insulating layer 124 and a passivation layer 173 may be formed between the pixel electrode (195a and 195b) and the sustain electrode line 125, and the pixel electrode (195a and 195b) may be formed as thin as 300 Å to 400 Å, the pixel electrode (195a and 195b) may not be able to be properly welded with the sustain electrode line 125.

Accordingly, the pixel of FIG. 14 may be transformed into a dead pixel simply through welding, however, the path established by welding to connect the pixel electrode (195a and 195b) and the sustain electrode line 125 may be disconnected due to voltage or heat generated in the pixel of FIG. 14 after long-term driving. In this manner, the pixel of FIG. 14 may be transformed back into a hot pixel. As such, cutting repair may be performed together with welding repair.

The false contact hole(s) 181, 182a and 182b, or 183a and 183b may be formed through photolithography using an optical mask during the formation of the contact holes 180a and 180b. When forming the contact holes 180a and 180b, the color filter 192 may be formed first, and then parts of the color filter 192 where the contact holes 180a and 180b are to be formed may be removed through photoresist exposure using a mask. In this manner, the false contact holes 181, 182a, 182b, 183a, and 183b may also be formed during a photoresist exposure process for forming the contact holes 180a and 180b. Accordingly, by replacing conventional masks to form contact holes 180a and 180b with masks to form both contact holes 180a and 180b, as well as one or more of the false contact holes 181, 182a, 182b, 183a, and 183b, an LCD having the false contact hole(s) 181, 182a and 182b, or 183a and 183b may be fabricated without additional processes; however, it is contemplated that one or more additional processes may be utilized in association with exemplary embodiments described herein.

Figure 16:
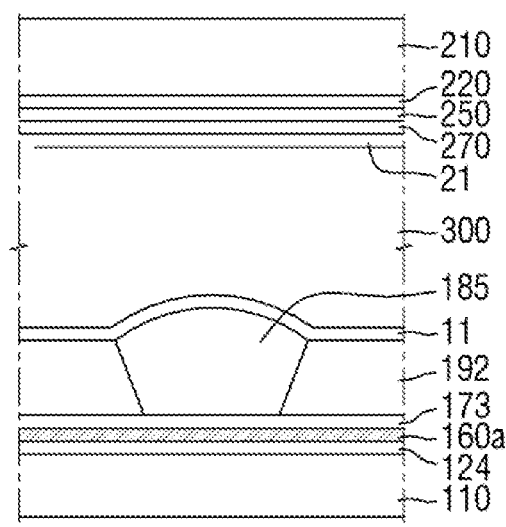
FIG. 16 is a cross-sectional view of an LCD including an organic layer, according to one or more exemplary embodiments.

FIG. 16 is a cross-sectional view of an LCD including an organic layer, according to one or more exemplary embodiments.

Referring to FIG. 16, the organic layer 185 may planarize a height difference generated by the false contact hole(s) 181, 182a and 182b, or 183a and 183b. It is also contemplated that the organic layer 185 may protrude from the false contact hole(s) 181, 182a and 182b, or 183a and 183b. To form the organic layer 185, an additional process of injecting an organic material may be performed after the removal of a color filter 192 from the false contact hole(s) 181, 182a and 182b, or 183a and 183b. The organic layer 185 may be formed by applying and drying a liquid-phase organic material. The organic layer 185 may be formed of an organic material with excellent planarization properties.

Figure 17:
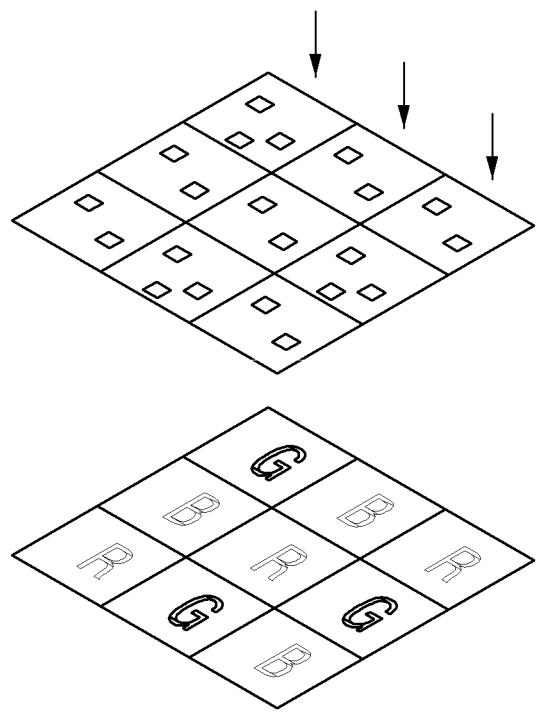
FIG. 17 is a schematic view of a process of forming contact holes in an LCD, according to one or more exemplary embodiments.

FIG. 17 is a schematic view of a process of forming contact holes in an LCD, according to one or more exemplary embodiments. The LCD of FIG. 17 is formed to include false contact holes only on (or in association with) green color filers 192.

Referring to FIG. 17, red color filters R, green color filters G, and blue color filters B may be alternately arranged. That is, three color filters having a different color from one another may be alternately arranged in rows and columns. A photoresist process may be performed using a mask such that the false contact hole(s) 181, 182a and 182b, or 183a and 183b may be formed only on the green color filters G. Since the green color filters G may generate radicals upon exposure to laser light (which may affect the liquid crystal layer 300), the false contact hole(s) 181, 182a and 182b, or 183a and 183b may be formed only on the green color filters G, thereby obtaining almost the same benefit of forming the false contact hole(s) 181, 182a and 182b, or 183a and 183b on the red color filters R, the green color filters G, and the blue color filters B.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
   a substrate;
   a gate line disposed on the substrate, the gate line extending in a first direction;
   a data line insulated from the gate line, the data line extending in a second direction intersecting the first direction;
   a pixel electrode disposed in a pixel region defined by the gate line and the data line;
   a source electrode connected to the data line;
   a drain electrode spaced apart from the source electrode; and
   a color filter layer disposed on the data line, the source electrode, and the drain electrode, the color filter layer comprising:
     a first contact hole exposing the drain electrode; and
     a false contact hole disposed over the source electrode, the false contact hole comprising a source electrode cutting line for cutting the source electrode to enable laser repair,
   wherein the pixel electrode is disposed on the color filter layer and is connected to the drain electrode through the first contact hole.

2. The display device of claim 1, wherein the first contact hole is separate from the false contact hole.

3. The display device of claim 2, further comprising:
   an organic layer comprising the false contact hole at least partially formed therein.

4. The display device of claim 2, wherein:
   the false contact hole is one of a plurality of false contact holes; and
   the plurality of false contact holes are disposed only in association with a pixel regions comprising a green color filter layer.

5. The display device of claim 2, wherein:
   the pixel electrode comprises:
     a first sub-pixel electrode; and
     a second sub-pixel electrode spaced apart from the first sub-pixel electrode in the first direction;
   the drain electrode comprises:
     a first drain electrode connected to the first sub-pixel electrode; and
     a second drain electrode connected to the second sub-pixel electrode;
   the color filter layer further comprises a second false contact hole and a third false contact hole;
   the second false contact hole is disposed over and exposes the first drain electrode; and
   the third false contact hole is disposed over and exposes the second drain electrode.

6. The display device of claim 5, wherein the gate line is disposed between the first sub-pixel electrode and the second sub-pixel electrode.

7. The display device of claim 6, wherein the second false contact hole extends in the first direction along the gate line to form a false contact line.

8. The display device of claim 7, further comprising:
   an organic layer comprising the second false contact hole at least partially formed therein.

9. The display device of claim 1, wherein the false contact hole comprises a portion exposing opposing lateral surfaces of the source electrode.

10. The display device of claim 1, wherein:
    the color filter layer further comprises a second false contact hole;
    the first contact hole and the second false contact hole are integrally formed with each other;
    a sidewall of the first contact hole contacts the pixel electrode; and
    a sidewall of the second false contact hole is spaced apart from the pixel electrode.

11. The display device of claim 10, wherein, in a plan view, the second false contact hole overlaps the pixel electrode and is spaced apart from the drain electrode.

12. The display device of claim 11, further comprising:
    an organic layer comprising at least one of the second false contact hole and the first contact hole at least partially formed therein.

* * * * *